United States Patent [19]

Nakamura et al.

[11] Patent Number: 5,717,222
[45] Date of Patent: Feb. 10, 1998

[54] SUPERCONDUCTING DEVICE HAVING AN EXTREMELY THIN SUPERCONDUCTING CHANNEL FORMED OF OXIDE SUPERCONDUCTOR MATERIAL AND METHOD FOR MANUFACTURING THE SAME

[75] Inventors: Takao Nakamura; Hiroshi Inada; Michitomo Iiyama, all of Osaka, Japan

[73] Assignee: Sumitomo Electric Industries, Ltd., Japan

[21] Appl. No.: 652,846

[22] Filed: May 23, 1996

Related U.S. Application Data

[63] Continuation of Ser. No. 383,670, Feb. 1, 1995, abandoned, which is a continuation of Ser. No. 101,099, Aug. 3, 1993, abandoned, which is a continuation of Ser. No. 766,187, Sep. 27, 1991, abandoned.

[30] Foreign Application Priority Data

| Sep. 27, 1990 | [JP] | Japan | 2-257855 |
| Sep. 27, 1990 | [JP] | Japan | 2-257859 |
| Sep. 27, 1990 | [JP] | Japan | 2-257860 |
| Sep. 27, 1990 | [JP] | Japan | 2-257861 |

[51] Int. Cl.⁶ .......................... H01L 47/00; H01L 29/06; H01L 39/22
[52] U.S. Cl. .................. 257/38; 257/36; 257/39; 505/190; 505/193; 505/234; 505/235
[58] Field of Search ........................... 357/5; 505/1, 701, 505/702, 700, 874, 190–193, 234–237; 427/62, 63; 257/33, 34, 35, 36–39

[56] References Cited

U.S. PATENT DOCUMENTS

| 4,751,563 | 6/1988 | Labowitz et al. ........................ 357/5 |
| 4,878,094 | 10/1989 | Balkanski ................................ 357/5 |

FOREIGN PATENT DOCUMENTS

| 0324044 | 7/1989 | European Pat. Off. . |
| 276746 | 8/1989 | European Pat. Off. . |

(List continued on next page.)

OTHER PUBLICATIONS

Patent Abstracts of Japan, vol. 13, No. 216, May 19, 1989; & JP-A-128876 (Matsushita Electric).

(List continued on next page.)

*Primary Examiner*—Wael Fahmy
*Assistant Examiner*—Howard Weiss
*Attorney, Agent, or Firm*—Beveridge, DeGrandi, Weilacher & Young, LLP

[57] ABSTRACT

A superconducting device includes a substrate, a projecting insulating region formed in a principal surface of the substrate, and a first thin film portion of an oxide superconductor formed on the projecting insulating region. Second and third thin film portions of an oxide superconductor are positioned at opposite sides of the projecting insulating region to be continuous to the first thin film portion, respectively, so that a superconducting current can flow through the first thin film portion between the second thin film portion and the third thin film portion. The second thin film portion and the third thin film portion has a thickness larger than that of the first thin film portion. The projecting insulating region is formed of an oxide which is composed of the same constituent elements of the oxide superconductor but which has the oxygen content smaller than that of said oxide superconductor. The superconducting device can be manufactured by forming on a surface of a substrate a compound oxide layer which is composed of the same constituent elements as those of an oxide superconductor but includes the oxygen amount less than that of the oxide superconductor, and which will be brought into an oxide superconductor when oxygen ions are injected, injecting oxygen ions into two separated portions of the compound oxide layer, so that the two separated portions of the compound oxide layer are converted into a pair of thick superconducting regions composed of the oxide superconductor, and heat-treating the layered structure in an oxygen atmosphere so that the oxygen is diffused into a portion of the compound oxide layer between the two separated portions of the compound oxide layer so as to constitute an extremely thin superconducting region.

19 Claims, 12 Drawing Sheets

U.S. PATENT DOCUMENTS 5,096,882  3/1992  Kato et al. .................................. 505/1

FOREIGN PATENT DOCUMENTS 354804  7/1990  European Pat. Off. .
276746  12/1990  European Pat. Off. .
280308  12/1990  European Pat. Off. .

OTHER PUBLICATIONS

Patent Abstracts of Japan, vol. 13, No. 46, Feb. 2, 1989; & JP-A-63239990 (Toshiba).

Yoshida et al, "Monolithic Device Fabrication Using High-TC Superconductor", IEDM 88, pp. 282–285.

Wu et al, "High Critical Currents in Epitaxial YBaCuO Thin Films on Silicon with Buffer Layers," Appl. Phys. Lett., vol. 54, #8, 20 Feb. 1989 pp. 754–756.

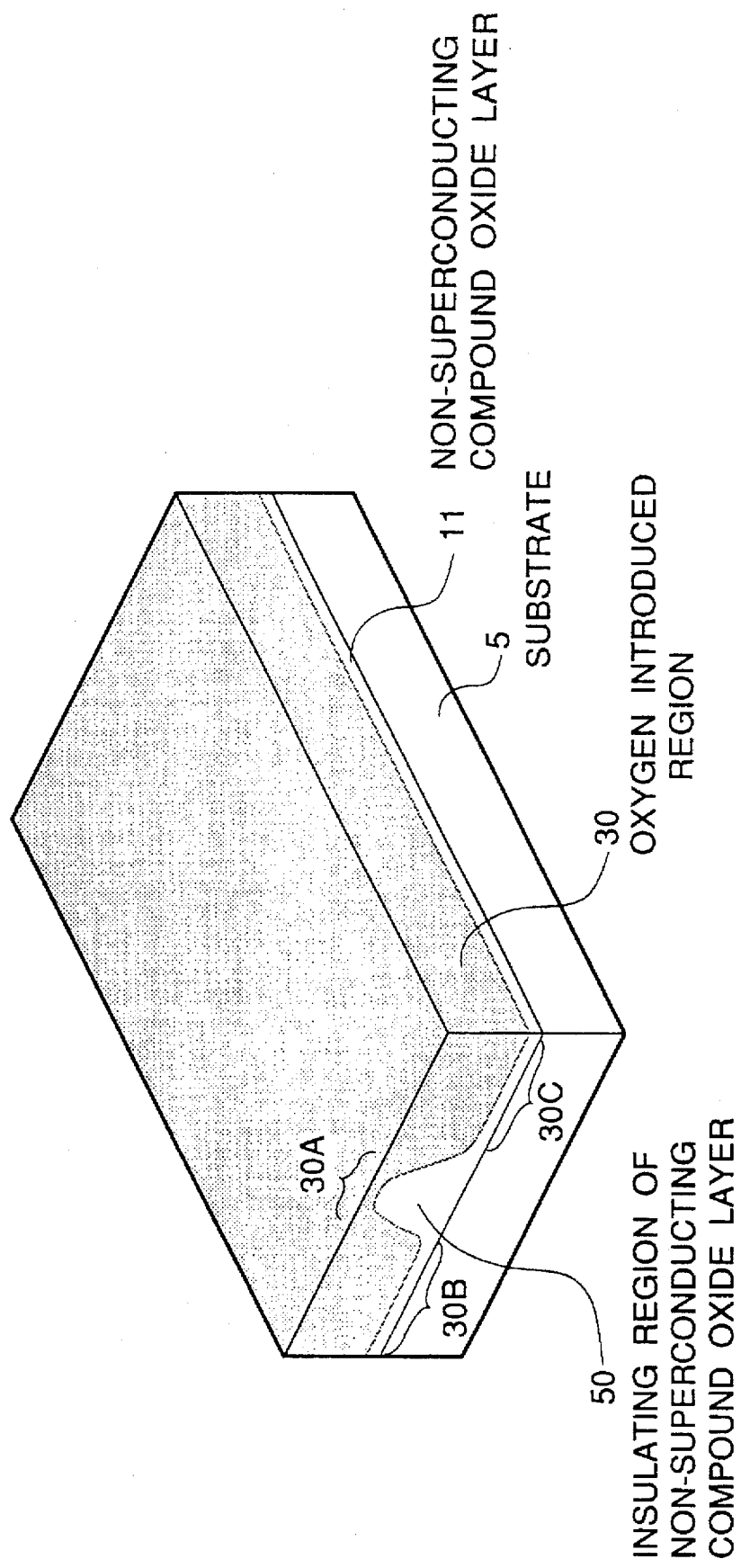

SUPERCONDUCTING DEVICE HAVING AN EXTREMELY THIN SUPERCONDUCTING CHANNEL FORMED OF OXIDE SUPERCONDUCTOR MATERIAL AND METHOD FOR MANUFACTURING THE SAME

This application is a continuation of application Ser. No. 08/383,670, filed Feb. 1, 1995 (now abandoned) which is a continuation of application Ser. No. 08/101,099 (now abandoned), filed Aug. 3, 1993, which is a continuation of application Ser. No. 07/766,187 (now abandoned), filed Sep. 27, 1991 which application is entirely incorporated herein by reference.

BACKGROUND OF THE INVENTION

1. Field of the Invention

The present invention relates to a superconducting device and a method for manufacturing the same, and more specifically to a superconducting device having a substantially planar upper surface and including an extremely thin superconducting channel formed of oxide superconductor material, and a method for manufacturing the same.

2. Description of Related Art

Typical three-terminal devices which utilize a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulator layer on the recessed or undercut rear surface of the portion of the semiconductor layer between the superconductor source electrode and the superconductor drain electrode.

A superconducting current flows through the semiconductor layer portion between the superconductor source electrode and the superconductor drain electrode due to a superconducting proximity effect, and is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has been recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the superconducting proximity effect, the superconductor source electrode and the superconductor drain electrode have to be located close to each other at a distance which is not greater than a few times the coherence length of the superconductor materials of the superconductor source electrode and the superconductor drain electrode. In particular, since an oxide superconductor has a short coherence length, if the superconductor source electrode and the superconductor drain electrode are foraged of the oxide superconductor material, a distance between the superconductor source electrode and the superconductor drain electrode has to be not greater than a few ten nanometers. However, it is very difficult to conduct a fine processing such as a fine pattern etching so as to ensure the very short separation distance. Because of this, in the prior art, it has been impossible to manufacture the super-FET composed of the oxide superconductor material.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this case, however, a thickness of the superconducting channel has to be made on the order of five nanometers.

On the other hand, typical two-terminal devices which utilize a superconductor include a so called Josephson device. This Josephson device can realize a high speed switching. One type of the Josephson device called a tunnel type comprises a pair of superconductors coupled to each other through a tunnel barrier.

The other type of the Josephson device formed of an oxide superconductor material thin film can be also realized in the form of a planer type, which is divided into a Dayem bridge (DMB) type and a variable thickness bridge (VTB) type.

The Dayem bridge type Josephson device has been formed of a constant thickness oxide superconductor thin film which is formed on a substrate and which is patterned in a plan view, so that a superconductor thin film region having a greatly narrow width is formed between a pair of superconductor thin film regions having a sufficient width. In other words, the pair of superconductor thin film regions having a sufficient width are coupled to each other by the superconductor thin film region having the greatly narrow width. Namely, a weak link of the Josephson junction in the superconductor thin film is formed at the greatly narrow width region.

On the other hand, the variable thickness bridge type Josephson device has been formed of an oxide superconductor thin film of a sufficient thickness which is formed on a substrate and which is partially etched or thinned in a thickness direction, so that a thinned oxide superconductor thin film portion is formed between a pair of superconductor thin film portions having the sufficient thickness. In other words, the pair of superconductor thin film portions having the sufficient thickness are coupled to each other by the thinned oxide superconductor thin film portion. Accordingly, a weak link of the Josephson junction is formed at the reduced thickness portion of the oxide superconductor thin film.

As would be understood from the above, the characteristics of the planar type Josephson device have a close relation to the width of the superconductor thin film region having the greatly narrow width in the Dayem bridge type Josephson device, and to the thickness of the thinned oxide superconductor thin film portion in the variable thickness bridge type Josephson device, both of which form the weak link of the Josephson junction. Therefore, in order to obtain a desired characteristics with a good repeatability, a high precision on a sub-micron level of the processing such as the etching is required.

The Dayem bridge type Josephson device can be said to be more preferable than the variable thickness bridge type Josephson device, since the Dayem bridge type Josephson device has a relatively planer surface, which is preferred in a integrated circuit. However, in order to form the weak link in the Dayem bridge type Josephson device, it is required to pattern an oxide superconductor thin film having the thickness on the order of 0.5 μm to 1.0 μm into a width of not greater than 0.2 μm. However, it is very difficult to conduct this fine patterning with good repeatability.

On the other hand, in the variable thickness bridge type Josephson device, the very fine pattering is not required in order to form the weak link. However, it is very difficult to uniformly control the remaining thickness of the thinned portion forming the weak link. In addition, the variable thickness bridge type Josephson device cannot have a satisfactorily planar surface. This is not preferable to the integrated circuit application.

SUMMARY OF THE INVENTION

Accordingly, it is an object of the present invention to provide a superconducting device and a method for manufacturing the same, which have overcome the above mentioned defects of the conventional ones.

Another object of the present invention is to provide a superconducting device having a planar upper surface and including a superconducting region constituted of an extremely thin oxide superconductor thin film, which can be manufactured by using existing established processing techniques with a good repeatability.

Still another object of the present invention is to provide an FET type superconducting device including a superconducting channel composed of an oxide superconducting layer having a planar upper surface and a partially reduced thickness, and a method for manufacturing the same with a good repeatability by using existing established processing techniques.

Further another object of the present invention is to provide a Josephson junction superconducting device including a weak link composed of an oxide superconducting layer having a planar upper surface and a partially reduced thickness, and a method for manufacturing the same with a good repeatability by using existing established processing techniques.

The above and other objects of the present invention are achieved in accordance with the present invention by a superconducting device comprising a substrate, a projecting insulating region formed on a principal surface of the substrate, a first thin film portion of an oxide superconductor formed on the projecting insulating region, a second thin film portion of an oxide superconductor positioned at one side of the projecting insulating region to be continuous to the first thin film portion, and a third thin film portion of an oxide superconductor positioned at the other side of the projecting insulating region to be continuous to the first thin film portion, so that a superconducting current can flow between the second thin film portion and the third thin film portion through the first thin film portion, the second thin film portion and the third thin film portion having a thickness larger than that of the first thin film portion, and the projecting insulating region being formed of a compound which does not show superconductivity but which will become an oxide superconductor when oxygen ions are injected.

Preferably, the compound is a compound oxide which is composed of the same constituent elements of the oxide superconductor but which has the oxygen content smaller than that of the oxide superconductor.

The first thin film portion of the oxide superconductor positioned on the projecting insulating region of the substrate can form a weak link of a Josephson junction. In this case, the superconducting device constitutes a Josephson device.

A gate electrode can be formed through an insulation barrier on the first thin film portion of the oxide superconductor positioned on the projecting insulating region of the substrate, so that the electric current flowing between the second and third thin film portions through the first thin film portion of the oxide superconductor is controlled by a voltage applied to the gate electrode. In this case, the superconducting device constitutes a super-FET, and the first thin film portion of the oxide superconductor constitutes a superconducting channel, and one of the second and third thin film portions forms a source region and the other forms a drain region. In this connection, a source electrode and a drain electrode can be formed on the source region and the drain region. The source electrode, the drain electrode and the gate electrodes can be formed of a superconducting material, but can also be formed of a material, such as a normal conducting material, other than the superconducting material.

As seen from the above, the super-FET in accordance with the present invention is characterized in that it comprises the superconducting channel constituted of the oxide superconductor thin film, and the superconducting source region and the superconducting drain region formed at opposite ends of the superconducting channel so as to cause a superconducting current to be able to flow through the superconducting channel between the superconducting source region and the superconducting drain region, and in that the superconducting source region and the superconducting drain region are separated from each other by the projecting insulating region which is formed on the substrate and is formed of a compound which is composed of the same constituent elements of the oxide superconductor but which has the oxygen content smaller than that of the oxide superconductor.

In the prior art super-FET, the superconducting current is flowed through the semiconductor channel due to the superconducting proximity effect. On the other hand, in the superconducting device in accordance with the present invention, a main current is caused to flow through the superconductor. Therefore, the finest processing technique is to form the superconducting channel composed of the extremely thin oxide superconductor thin film. In the structure of the superconducting device in accordance with the present invention, it is possible to form this extremely thin superconducting channel with neither a fine-etching nor a fine-patterning of the superconducting thin film. Therefore, it is possible to relax the limitation in the fine processing techniques such as a fine-etching or a fine-patterning which has been required in the case that conventional super-FET and the conventional superconducting-base transistor are formed of an oxide superconductor material. In addition, the stacked structure of the oxide superconducting layer and the semiconductor layer is no longer necessary.

In the super-FET, in order to ensure that the superconducting channel can be turned on and off by a voltage applied to the gate electrode, a thickness of the superconducting channel has to be on the order of five nanometers in the direction of an electric field created by the voltage applied to the gate electrode. This extremely thin superconducting channel can be easily realized or formed in accordance with the method of the present invention.

Namely, according to the method of a first aspect of the present invention, there is used a substrate having on its surface a compound layer which will be brought into an oxide superconductor when oxygen ions are injected. Then, an extremely thin film of oxide superconductor having a thickness on the order of about five nanometers is formed on a surface of the compound layer of the substrate. Such an extremely thin oxide superconductor thin film can be formed in a conventional process by precisely controlling the growth speed and the growth time of the thin film. For this purpose, a sputtering can be used. However, since the oxide superconductor crystal has a multi-layer structure in which respective constituent elements are stacked in a layered structure, it is possible to stack a desired number of unit cells of oxide superconductor, by using a MBE (molecular beam epitaxy).

The extremely thin oxide superconductor thin film thus formed or deposited is very preferable in thickness to form a superconducting channel in the super-FET and a weak link in the VTB type Josephson device, but insufficient in thickness to form a source region and a drain region or electrode regions of the Josephson device. Therefore, the superconducting layer in the source region and the drain region or in the electrode regions of the Josephson device must be further thickened. The method in accordance with the present invention is very effective in thickening these regions while maintaining the thickness of the extremely thin oxide superconductor thin film in the superconducting channel zone or in the weak link region. Namely, using a gate electrode as a mask or a mask layer on a selected portion of the extremely thin film of oxide superconductor, oxygen ions are injected into the compound layer through the extremely thin film of oxide superconductor, so that, a portion of the extremely thin film of oxide superconductor masked by a mask or a gate electrode constitutes a superconducting channel or a weak link, and both side not-masked portions of the compound layer, which are positioned at opposite sides of the gate electrode or the mask, are convened into a pair of superconducting regions composed of an oxide superconductor, which can constitute a superconducting source region and a superconducting drain region of the super-FET, respectively, or a pair of electrode regions of the Josephson device.

According to the method of a second aspect of the present invention, there is prepared a substrate having on its surface a compound layer which will become an oxide superconductor when oxygen ions are injected. The compound layer is preferred to have a thickness sufficient to form a superconducting source region and a superconducting drain region of the super-FET, or electrode regions of the Josephson device, for example, on the order of about 200 to 300 nanometers.

Then, oxygen ions are injected into two portions of the compound layer separated from each other, so that the two separated portions of the compound layer are converted into a pair of thick superconducting regions composed of the oxide superconductor which can constitute a superconducting source region and a superconducting drain region in the super-FET or a pair of electrodes in the VTB Josephson device. Then, the layered structure is heat-treated in an oxygen atmosphere so that the oxygen is diffused into a portion of the compound layer between the two separated oxygen ion-injected portions of the compound layer so as to form an extremely thin superconducting region which can constitute a superconducting channel in the super-FET or a weak link in the VTB Josephson device.

The oxide superconductor is unstable in the number of oxygens contained in an oxide superconductor crystal, and it is possible to change the number of oxygens contained in the oxide superconductor crystal by the heat-treatment. In addition, the oxide superconductor easily changes its characteristics dependently upon the number of oxygens contained in an oxide superconductor crystal. Specifically, if the number of oxygens contained in the oxide superconductor crystal is smaller than an appropriate value, the critical temperature greatly lowers, or the superconductivity itself is lost.

As mentioned above, in the method of the second aspect of the present invention, the compound layer formed on the surface of the substrate is composed of for example a compound oxide which is composed of the same constituent elements as those of an oxide superconductor but includes the oxygen amount less than that of the oxide superconductor, and the compound layer is partially converted into an oxide superconductor, by injecting oxygen ions into a selected portion of the compound layer, and also heat-treating the layered structure in the oxygen atmosphere. By adjusting the acceleration voltage of the oxygen ions, the partial pressure of oxygen, the heat-treatment temperature and the heat-treatment time, the foraged oxide superconductor can have a suitable thickness. In addition, since oxygen can easily move or diffuse in the oxide superconductor in a direction perpendicular to the c-axis of the oxide superconductor crystal, it is preferred that a groove near to the gate electrode and in parallel to the c-axis of the oxide superconductor crystal is formed in a portion of the oxide thin film to be diffused with oxygen, and the heat-treatment is performed after the oxygen is injected.

As mentioned hereinbefore, in the super-FET permitting the superconducting channel to be completely turned on and off by the gate voltage, a thickness of the superconducting channel has to be on the order of five nanometers, however this thickness is insufficient to form a source region and a drain region. Therefore, the superconducting layer in the source region and the drain region must be further thickened for example to about 200 nanometers. In this second aspect of the invention, the above mentioned compound oxide layer is formed to have a thickness of about 200 nanometers, and oxygen ions are injected into portions of the compound oxide layer which are respectively to constitute the superconducting source region and the superconducting drain regions. On the other hand, since the superconducting channel is as extremely thin as about five nanometers, the superconducting channel is formed by diffusion from the superconducting source region and the superconducting drain regions under the heat-treatment.

On the other hand, as mentioned hereinbefore, the conventional Josephson device has the weak link which is formed by etching or thinning or recessing a weak link portion of a deposited superconductor thin film having a substantial thickness. However, the film thickness or the film width which can constitutes the weak link must be extremely small, and therefore, an extremely high degree of processing technique has been required in order to manufacture the Josephson device having the desired characteristics.

Oxygens diffused into a compound oxide layer which is composed of the same constituent elements as those of an oxide superconductor but includes the oxygen amount less than that of the oxide superconductor can easily move in a horizontal direction when it is heated in an oxygen atmosphere. With this diffusion property of oxygen, the weak link is formed. Therefore, the fine-processing such as a fine-etching is no longer necessary, and the Josephson device can be formed with high repeatability and with high controllability of characteristics.

In a preferred embodiment, the oxide superconductor thin film is formed of a material selected from the group consisting of a Y-Ba-Cu-O type compound oxide superconductor material, a Bi-Sr-Ca-Cu-O type compound oxide superconductor material, and a Tl-Ba-Ca-Cu-O type compound oxide superconductor material.

In addition, the substrate, on which the oxide superconductor thin film is deposited, can be formed of an insulating substrate, preferably an oxide single crystalline substrate such as MgO, SrTiO$_3$, and CdNdAlO$_4$, which has on its surface a compound layer which will be brought into an oxide superconductor when oxygen ions are injected. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a MgAlO$_4$ layer and a BaTiO$_3$ layer if a silicon substrate is used.

The above and other objects, features and advantages of the present invention will be apparent from the following description of preferred embodiments of the invention with reference to the accompanying drawings.

BRIEF DESCRIPTION OF THE DRAWINGS

FIG. 4 is a diagrammatic perspective view of one embodiment of the superconducting device in accordance with the present invention.

DESCRIPTION OF THE PREFERRED EMBODIMENTS

Embodiment 1

Referring to FIGS. 1A to 1H, a first embodiment of the process in accordance with the present invention for manufacturing the super-FET will be described.

Figure 1A:
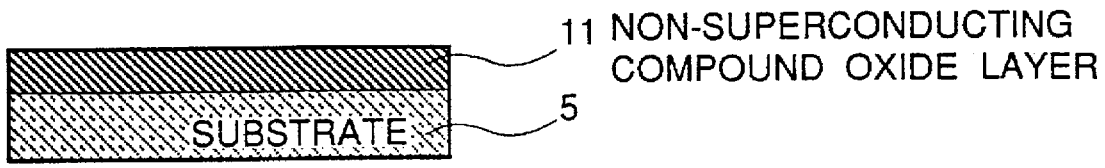
FIGS. 1A to 1H are diagrammatic sectional views for illustrating a first embodiment of the process in accordance with the present invention for manufacturing the super-FET.

As shown in FIG. 1A, there is prepared a substrate 5 having a compound oxide layer 11 of $Y_1Ba_2Cu_3O_{7-y}$ formed on its principal surface thereof. The $Y_1Ba_2Cu_3O_{7-y}$ layer 11 having a thickness of, for example, 200 nanometers is deposited on the principal surface of the substrate 5 by, for example, a sputtering process. The substrate 5 is formed of, for example, an insulating substrate such as a MgO (100) substrate, a SrTiO$_3$ (100) substrate or others which are coated with the compound oxide layer 11, or a semiconductor substrate such as a silicon substrate having a principal surface coated with an insulating film and further with the compound oxide layer 11. The principal surface of the silicon substrate is preferably continuously coated with MgAlO$_4$ by a CVD (chemical vapor deposition) and also with BaTiO$_3$ by a sputtering process, and thereafter, also coated with the compound oxide layer 11.

Figure 1B:
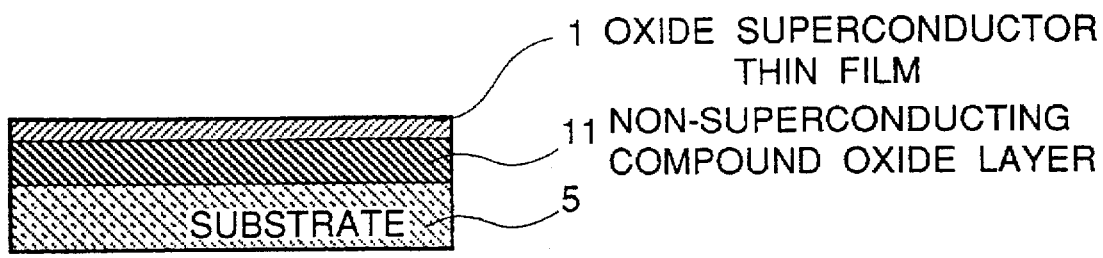

As shown in FIG. 1B, an extremely thin oxide superconductor thin film I of $Y_1Ba_2Cu_3O_{7-x}$ having a thickness on the order of about five nanometers is deposited on the principal surface of the substrate 5, namely on the $Y_1Ba_2Cu_3O_{7-y}$ layer 11, by for example an off-axis sputtering, a reactive evaporation, an MBE (molecular beam epitaxy), a CVD, etc. This extremely thin oxide superconductor thin film 1 forms the superconducting channel when the super-FET is completed. Comparing $Y_1Ba_2Cu_3O_{7-y}$ with the $Y_1Ba_2Cu_3O_{7-x}$ oxide superconductor, they are formed of the same constituent elements, but y>x, namely, $Y_1Ba_2Cu_3O_{7-y}$ contains the oxygen number less than that of $Y_1Ba_2Cu_3O_{7-x}$ so that $Y_1Ba_2Cu_3O_{7-y}$ shows an electrical insulation. But, $Y_1Ba_2Cu_3O_{7-y}$ easily becomes $Y_1Ba_2Cu_3O_{7-x}$ if oxygen ions are injected.

In addition, a c-axis orientated thin film is preferably deposited, since the c-axis orientated thin film has a large critical current density in the direction in parallel to the substrate surface.

Figure 1C:
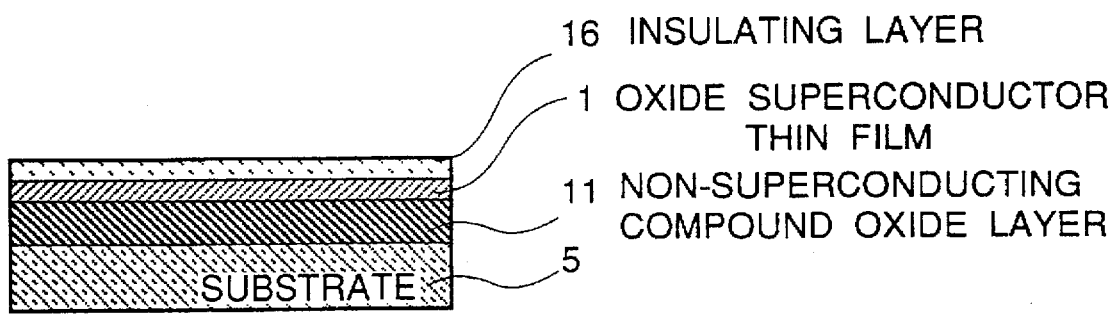

Then, as shown in FIG. 1C, an insulating layer 16 is deposited on the oxide superconductor thin film 1. The insulating layer 16 is deposited to have a thickness of not less than ten nanometers. In addition, the insulating layer 16 is formed of an insulating material such as MgO, which does not form a large density of energy levels between the superconductor thin film 1 and the insulating layer 16.

Figure 1D:
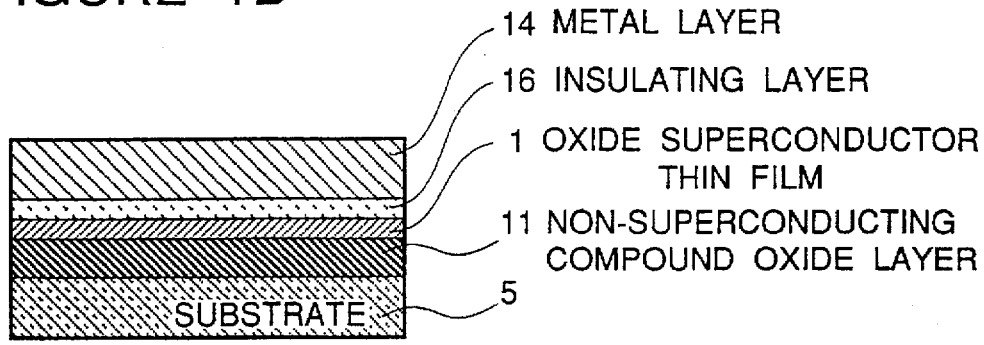

Furthermore, as shown in FIG. 1D, a metal layer 14 for a gate electrode is deposited on the insulating layer 16. The metal layer 14 is preferably formed of a refractory metal such as Ti, W, etc., or Au, or a silicide thereof.

Figure 1E:
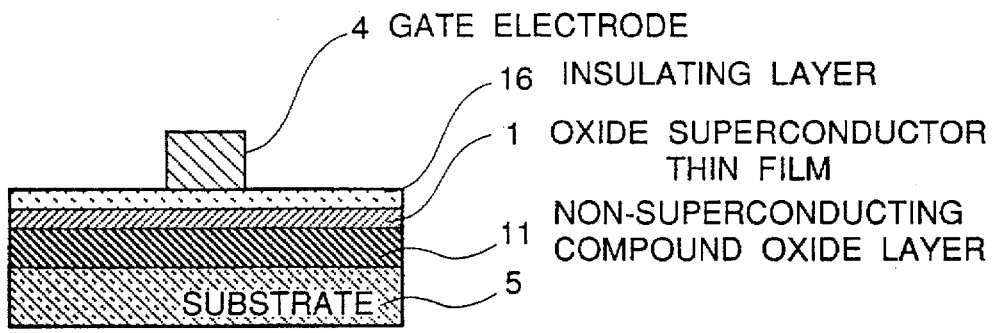

Thereafter, the metal layer 14 is selectively etched so as remove all of the metal layer excluding a portion which becomes the gate electrode when the super-FET is completed, so that the gate electrode 4 is formed as shown in FIG. 1E.

Using the thus formed gate electrode 4 as a mask, oxygen ions are ion-implanted so that a portion of the compound oxide layer 11 not masked by the gate electrode 4 is converted into an oxide superconductor.

Figure 1F:
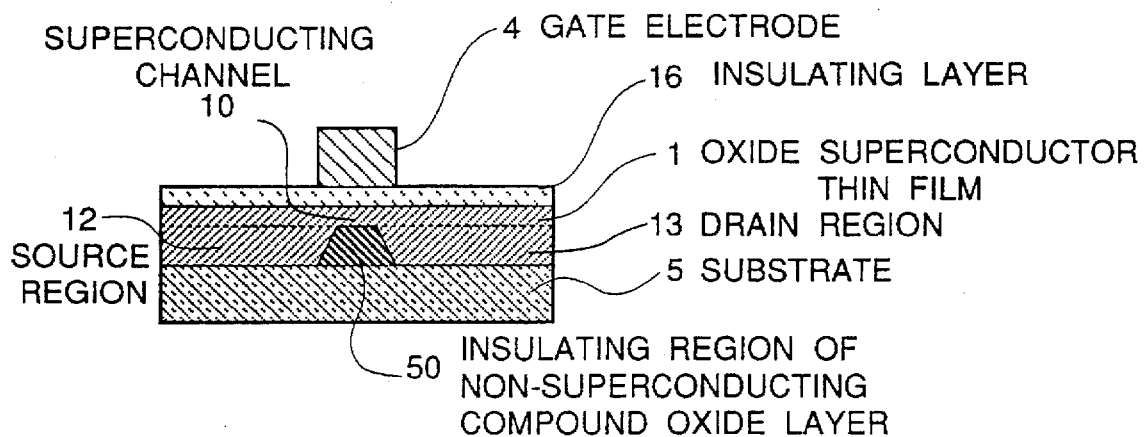

This ion-implantation is performed at an acceleration energy of not greater than 150 KeV. Thereafter, the substrate 5 is heated to 450° C., and heat-treated for 30 minutes at 450° C. With this heat-treatment, as shown in FIG. 1F, a superconducting source region 12 and a superconducting drain region 13 are formed continuously to the oxide superconductor thin film 1. Thus, a portion of the oxide superconductor thin film 1 below the gate electrode 4 constitutes a superconducting channel 10. On the other hand, a portion of the oxide thin film 11 under the superconducting channel 10 is maintained in an insulating condition, and therefore, constitutes a projecting insulating region 50.

In place of the above mentioned ion-implantation and heat-treatment process, it is possible to irradiate a focused ion beam so as to form the superconducting source region 12 and the superconducting drain region 13. In this case, it is also preferred that oxygen ions are irradiated under an energy of not greater than 150 KeV.

Figure 1G:
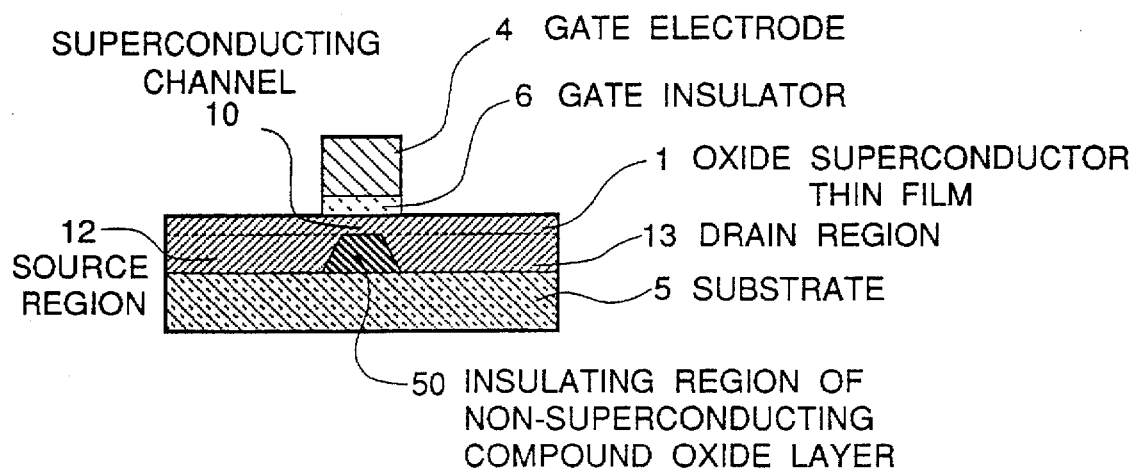

After the superconducting source region 12 and the superconducting drain region 13 are formed, the insulating layer 16 is selectively etched in a self alignment to file gate electrode 4, so that a gate insulator 6 is left on the superconducting channel 10 and only under the gate electrode 4, as shown in FIG. 1G. In this connection, it is desired that the gate insulator 6 is side-etched in comparison with the gate electrode 4 so that the gate insulator 6 has a length shorter than that of the gate electrode 4.

Figure 1H:
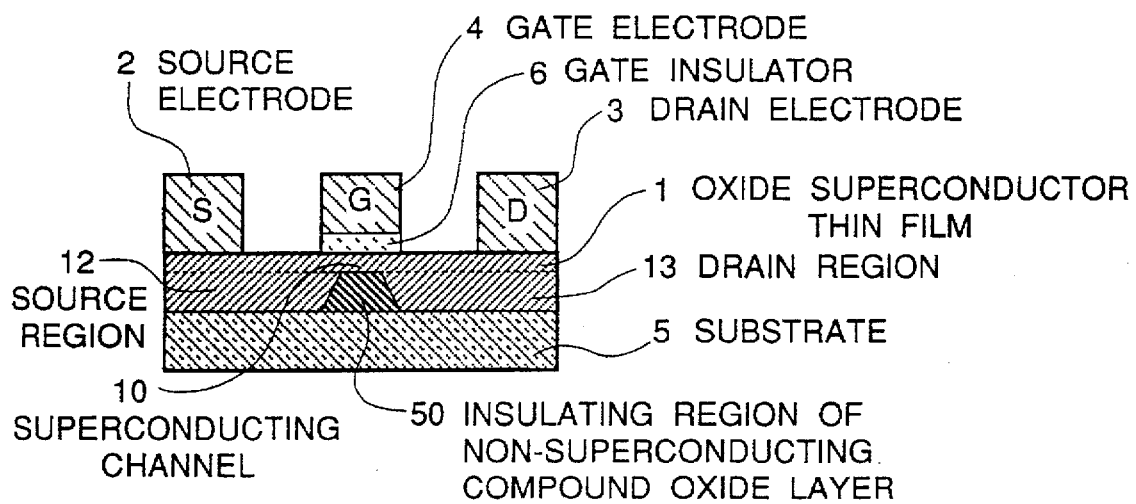

Finally, as shown in FIG. 1H, a source electrode 2 and a drain electrode 3 are formed on the superconducting source region 12 and the superconducting drain region 13, respectively. The source electrode 2 and the drain electrode 3 are formed of, for example, a refractory metal such as Ti, W, etc., or Au, or a silicide thereof, similarly to the gate electrode 4.

Thus, the super-FET as shown in FIG. 1H is completed. The super-FET includes the oxide superconductor thin film 1 having the thickness of about five nanometers formed on the substrate 5. A central portion of the oxide superconductor thin film 1 constitutes the superconducting channel 10, on which the gate electrode 4 is located through the insulator layer (gate insulator) 6. At both sides of the superconducting channel 10 in the substrate 5, the superconducting source region 12 and the superconducting drain region 13 having the thickness of about 200 nanometers are formed continuously to the superconducting channel 10. The source electrode 2 and the drain electrode 3 are formed on the superconducting source region 12 and the superconducting drain region 13, respectively.

As explained above, if the above mentioned super-FET is manufactured in accordance with the above mentioned process, the limitation in the fine processing technique required for manufacturing the super-FET is relaxed. In addition, since the upper surface of the superconductor thin film is planarized, it becomes easy to form conductor wirings in a later process. Accordingly, it is easy to manufacture the super-FET with good repeatability, and the manufactured super-FET has a stable performance.

Embodiment 2

Referring to FIGS. 2A to 2J, a second embodiment of the process in accordance with the present invention for manufacturing the superconducting device will be described.

Figure 2A:
FIGS. 2A to 2J are diagrammatic sectional views for illustrating a second embodiment of the process in accordance with the present invention for manufacturing the super-FET.

As shown in FIG. 2A, there is prepared a substrate 5, similar to the substrate 5 of the Embodiment 1.

Figure 2B:
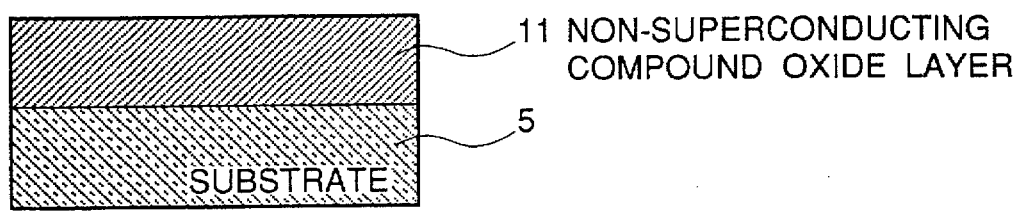

As shown in FIG. 2B, a compound oxide layer 11 of $Y_1Ba_2Cu_3O_{7-y}$, which is similar to the compound oxide layer 11 of the Embodiment 1 and which has a thickness of about 200 nanometers, is formed on a principal surface of the substrate 5 by, for example, an off-axis sputtering. The off-axis sputtering is performed under the same condition as that of the Embodiment 1. In this connection, a c-axis orientated thin film is preferably deposited, since the c-axis orientated thin film has a large critical current density in the direction in parallel to the substrate surface.

Figure 2C:
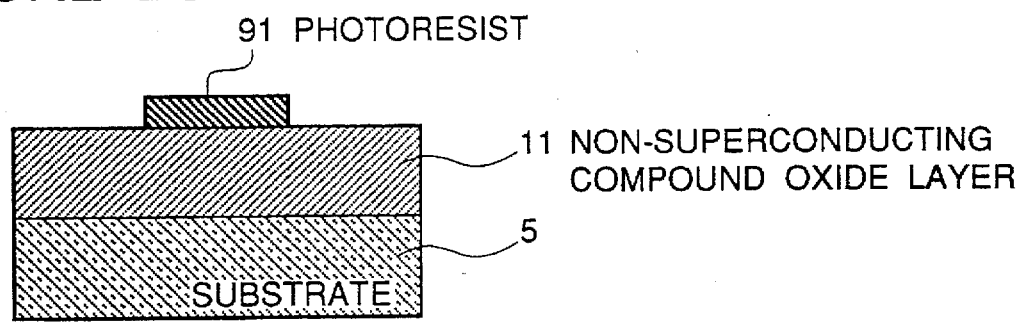
Figure 2D:
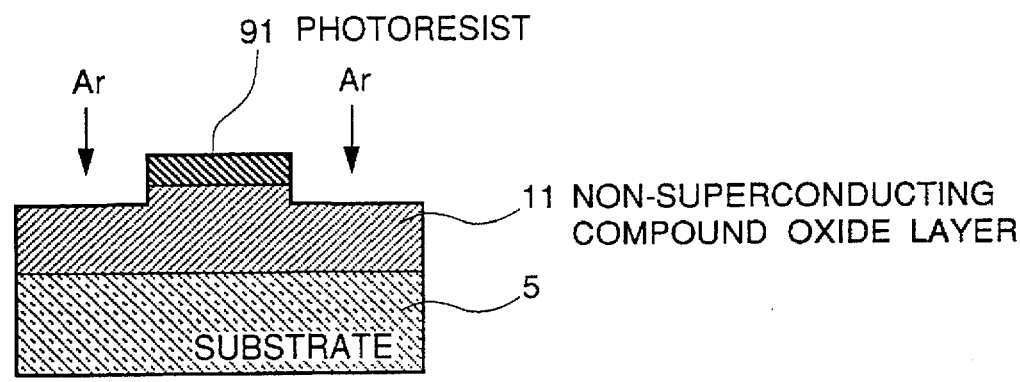

Then, as shown in FIG. 2C, a photoresist film 91 is deposited on the oxide thin film 11 at a position of a gate electrode to be formed in future. An exposed portion of the oxide thin film 11 is etched with Ar-ions by a thickness of about five to ten nanometers, as shown in FIG. 2D. The condition for the Ar-ion etching is that the substrate temperature is 100 K and the acceleration energy is 3 KeV.

Figure 2E:
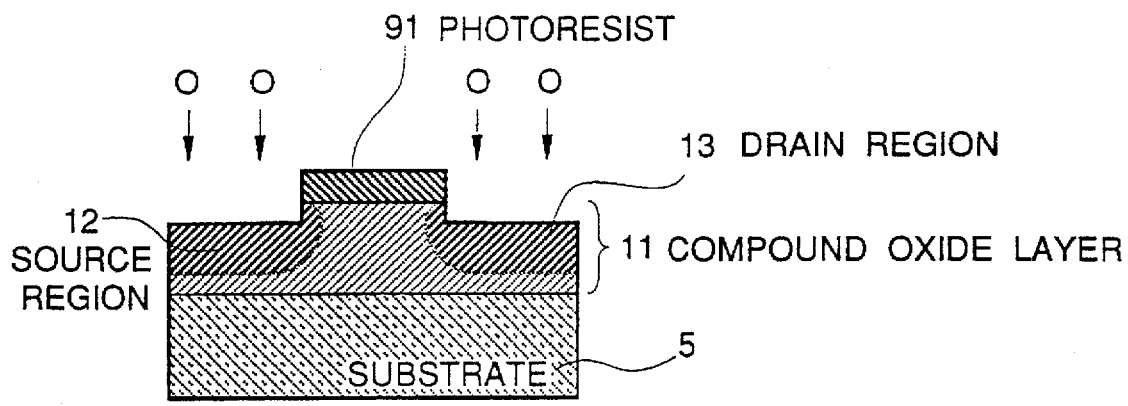

Thereafter, oxygen ions are ion-implanted so that a superconducting source region 12 and a superconducting drain region 13 having a substantial thickness are formed in the oxide thin film 11 as shown in FIG. 2E. The condition for the oxygen ion-implantation is that the acceleration energy is 40 KeV and the dose is $1\times10^{15}$ to $1\times10^{16}$ ions/cm$^2$.

Figure 2F:
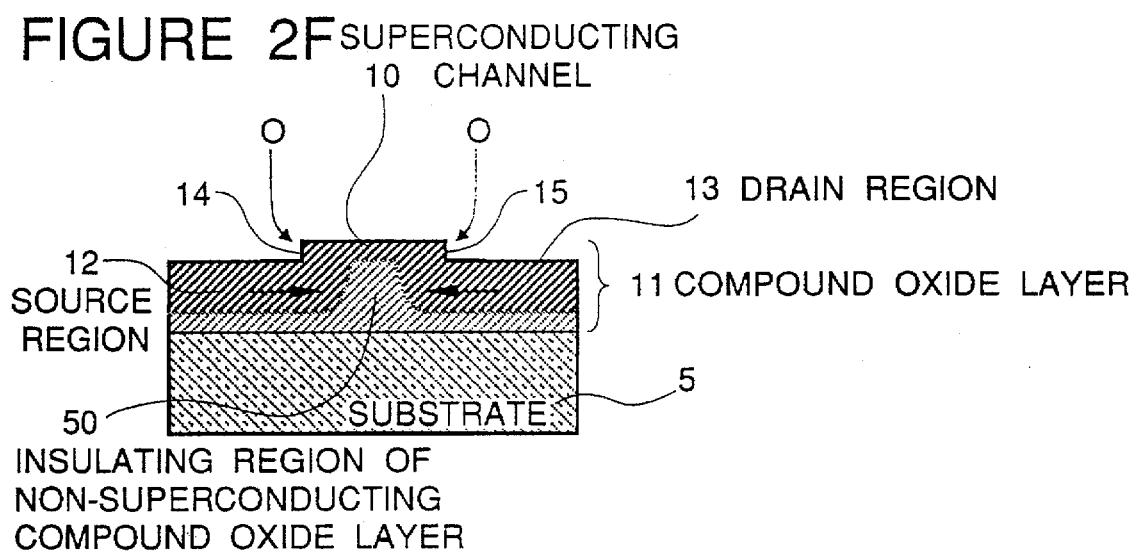

After the photoresist 91 is removed, the substrate 5 is heated in an oxygen atmosphere, so that oxygen is diffused from the exposed surface of the oxide thin film 11, and a pair of stepped portions 14 and 15 are formed on the surface of the oxide thin film 11 to correspond to the photoresist 91. As a result, a superconducting channel 10 is formed as shown in FIG. 2F. Since, as noted before, the oxygen diffuses horizontally, the thickness of the superconducting channel 10 is substantially the same as the height of the stepped portions 14 and 15. Also, the superconducting channel 10 lies in the same plane as the stepped portions 14 and 15. The condition for the heat-treatment is that the temperature is 350° C., the partial oxygen pressure is $1\times10^4$ Pa and the time is one hour.

A portion of the oxide thin film 11 under the superconducting channel 10 is maintained in an insulating condition, and therefore, constitutes an insulating region 50.

Figure 2G:
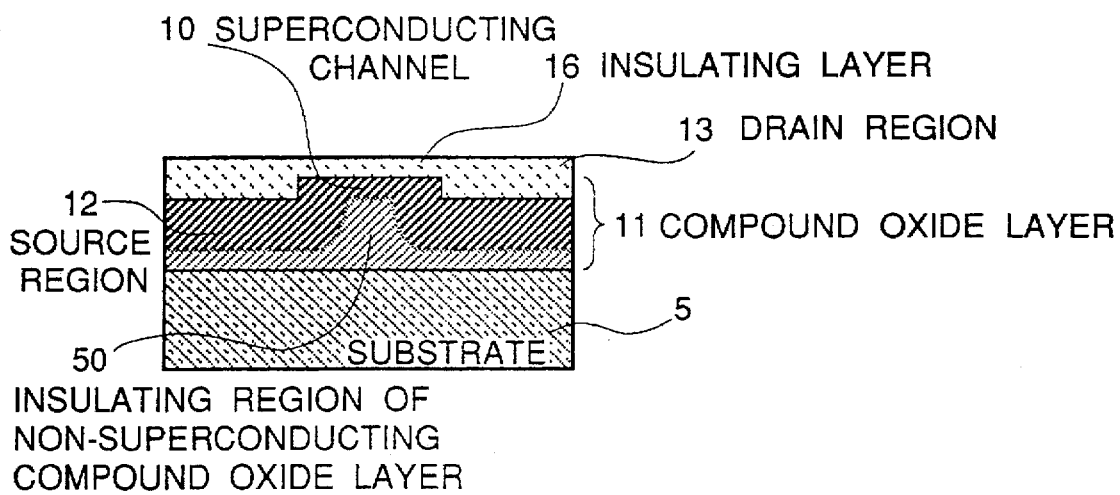

As shown in FIG. 2G, an insulating layer 16 formed of, for example, a silicon nitride, is deposited to cover the whole surface of the oxide thin film 11 in which the superconducting channel 10, the superconducting source region 12 and the superconducting drain region 13 are formed. This insulating layer 16 has a thickness sufficient to prevent a tunnel current, for example, a thickness of not less than 10 nanometers. In addition, the insulating layer 16 is formed of an insulating material which does not form a large density of energy levels between the superconductor thin film and the insulating layer 16. Furthermore, in view of a mechanical stress, the insulating layer 16 is preferred to have a composition which is near to that of the oxide superconductor and which can be formed continuously on the oxide superconductor after heat-treatment.

Figure 2H:
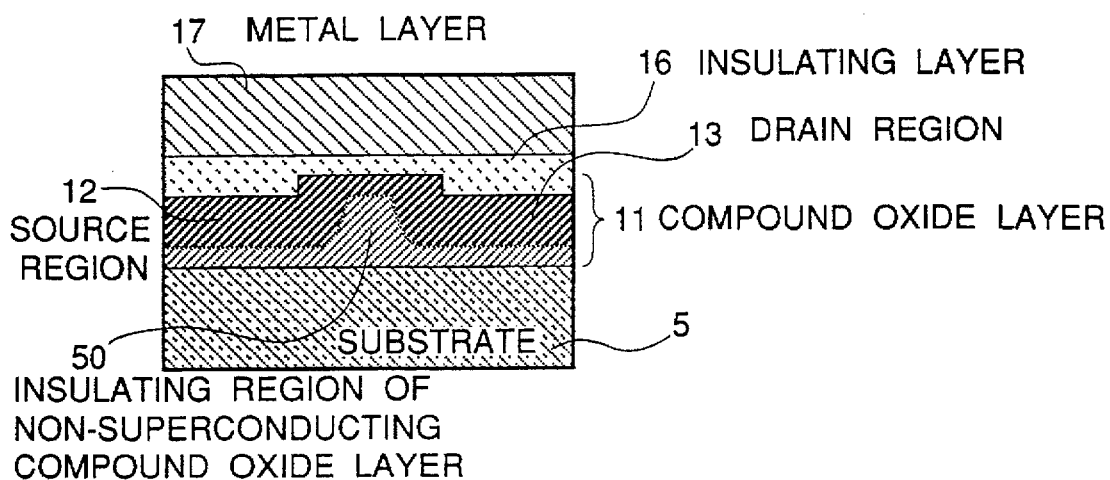

As shown in FIG. 2H, a metal layer 17 for a gate electrode is deposited on the insulating layer 16. The metal layer 17 is preferably formed of a refractory metal such as Ti, W, etc., or Au, or a silicide thereof.

Figure 2I:
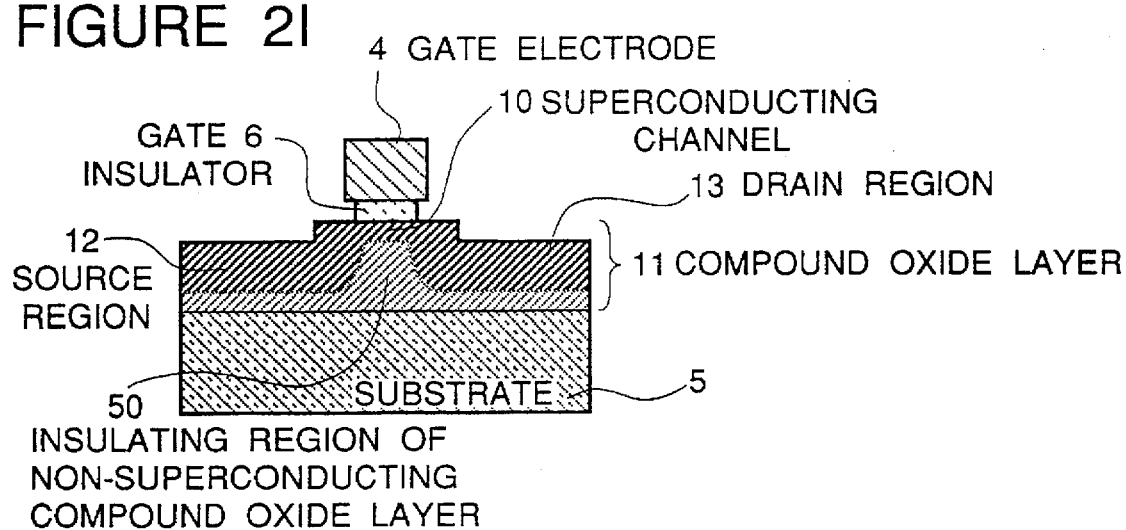

Thereafter, the metal layer 14 and the insulating layer 16 are selectively etched, so that a gate electrode 4 and a gate insulator 6 are formed as shown in FIG. 2I. In this connection, it is desired that the insulating layer 16 is side-etched in comparison with the gate electrode 4 so that the gate insulator 6 has a length shorter than that of the gate electrode 4.

Figure 2J:
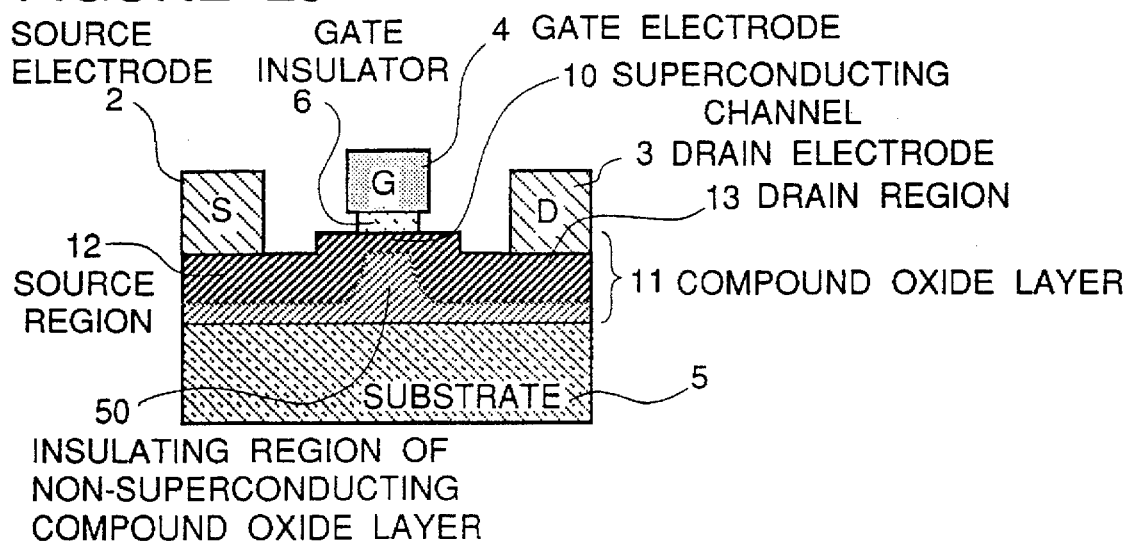

Finally, as shown in FIG. 2J, a source electrode 2 and a drain electrode 3 are formed on the superconducting source region 12 and the superconducting drain region 13, respectively. The source electrode 2 and the drain electrode 3 are formed of, for example, a refractory metal such as Ti, W, etc., or Au, or a silicide thereof, similarly to the gate electrode 4.

As explained above, if the above mentioned super-FET is manufactured in accordance with the above mentioned process, the limitation in the fine processing technique required for manufacturing the super-FET is relaxed. In addition, since the substantially planarized upper surface is obtained, it become easy to form conductor wirings in a later process. Accordingly, it is easy to manufacture the super-FET with good repeatability, and the manufactured super-FET has a stable performance.

Embodiment 3

Referring to FIGS. 3A to 3J, a third embodiment of the process in accordance with the present invention for manufacturing the superconducting device will be described.

Figure 3A:
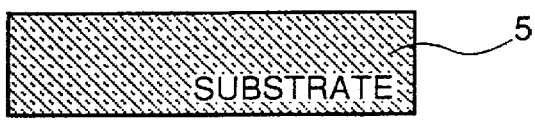
FIGS. 3A to 3J are diagrammatic sectional views for illustrating a third embodiment of the process in accordance with the present invention for manufacturing the super-FET.

As shown in FIG. 3A, there is prepared a substrate 5, similar to the substrate 5 of the Embodiment 1.

Figure 3B:
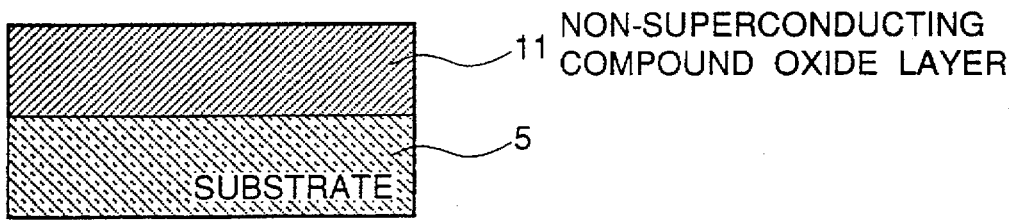

As shown in FIG. 3B, a compound oxide layer 11 of $Y_1Ba_2Cu_3O_{7-y}$, which is similar to the compound oxide layer 11 of the Embodiment 1 and which has a thickness of about 200 nanometers, is formed on a principal surface of the substrate 5 by, for example, an off-axis sputtering. The off-axis sputtering is performed under the same condition as that of the Embodiment 1. In this connection, a c-axis orientated thin film is preferably deposited, since the c-axis orientated thin film has a large critical current density in the direction in parallel to the substrate surface.

Figure 3C:
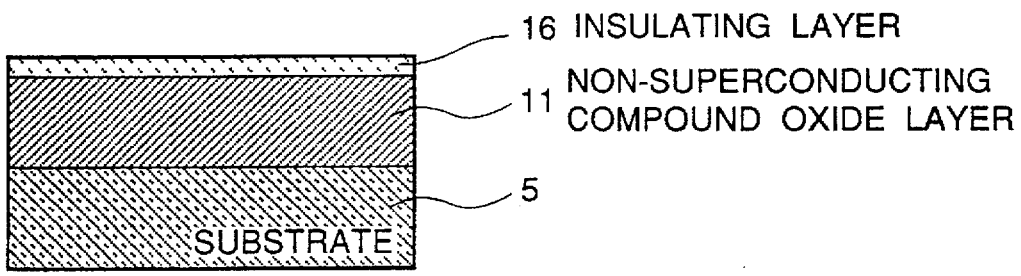

As shown in FIG. 3C, an insulating layer 16 formed of, for example, a silicon nitride, is deposited to cover the whole surface of the oxide thin film 11. This insulating layer 16 has a thickness sufficient to preventing a tunnel current, for example, a thickness of not less than 10 nanometers. In addition, the insulating layer 16 is formed of an insulating material which does not form a large density of energy levels between the superconductor thin film and the insulating layer 16. Furthermore, in view of a mechanical stress, the insulating layer 16 is preferred to have a composition near to that of the oxide superconductor and be formed continuous on the oxide superconductor.

Figure 3D:
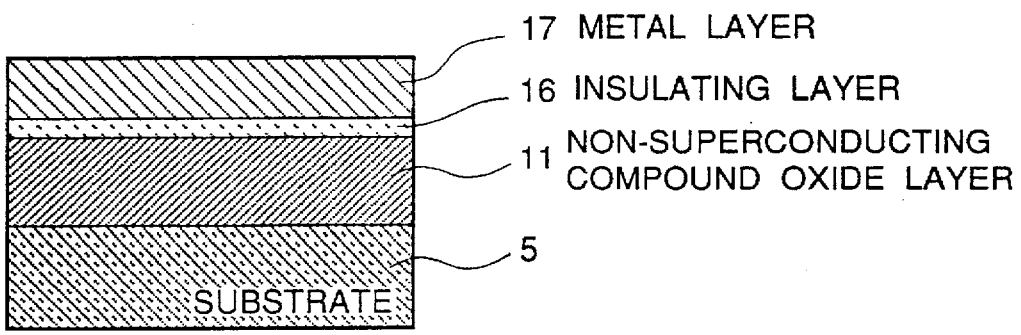
Figure 3E:
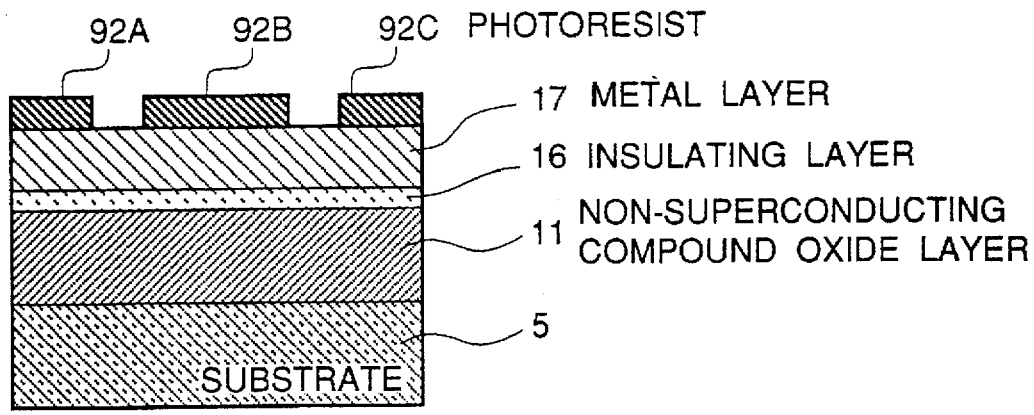

As shown in FIG. 3D, a metal layer 17 for a gate electrode is deposited on the insulating layer 16. The metal layer 17 is preferably formed of a refractory metal such as Ti, W, etc., or Au, or a silicide thereof. Then, as shown in FIG. 3E, patterned photoresists 92A, 92B and 92C are deposited on the metal layer 17. A central patterned photoresist 92B corresponds to a gate pattern but is larger than the size of a gate electrode to be formed.

Figure 3F:
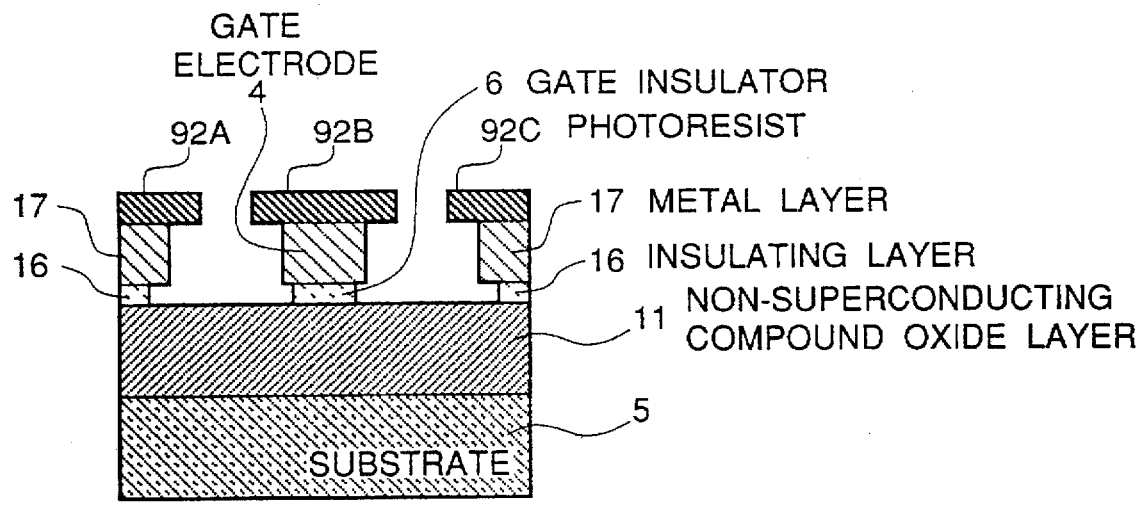

Thereafter, the metal layer 14 and the insulating layer 16 are selectively etched using the patterned photoresists 92A, 92B and 92C as a mask, so that a gate electrode 4 and a gate insulator 6 is formed as shown in FIG. 3F. In this connection, it is desired that the insulating layer 16 is side-etched in comparison with the gate electrode 4 so that the gate insulator 6 has a length shorter than that of the gate electrode 4.

Figure 3G:
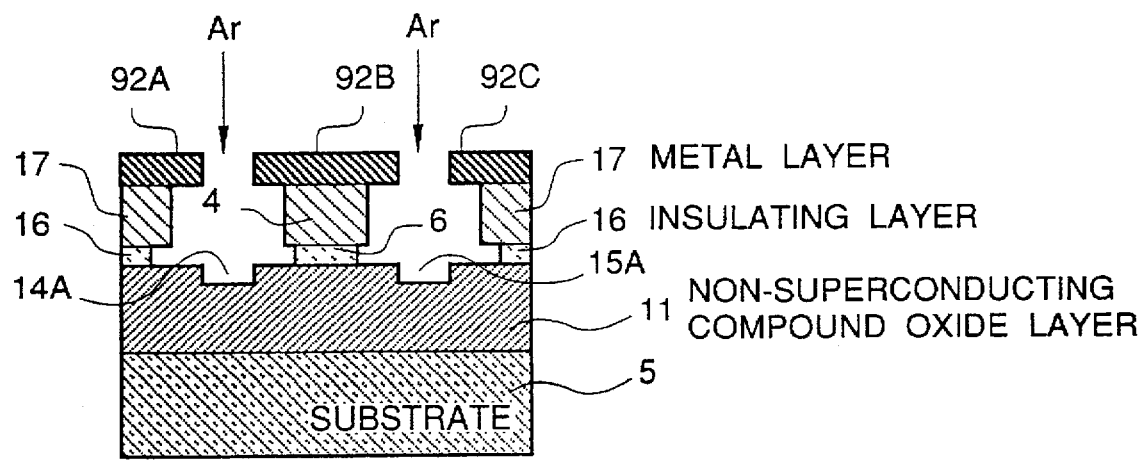

After the gate electrode 4 and the gate insulator 6 are formed, an exposed portion of the oxide thin film 11 is anisotropically etched with Ar-ions using the patterned photoresists 92A, 92B and 92C as a mask, so that shallow grooves 14A and 15A having a depth of about five to ten nanometers are formed, as shown in FIG. 3G.

Figure 3H:
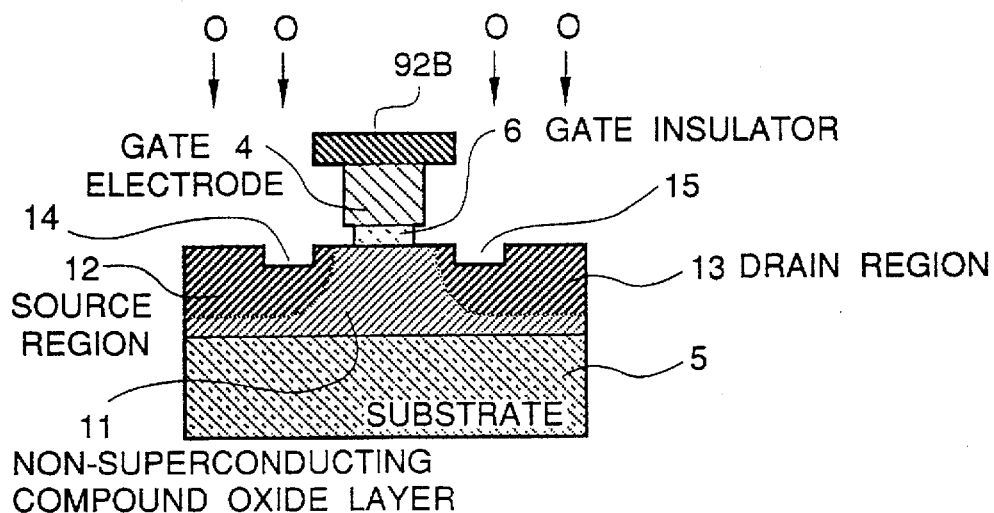

The remaining metal layer 17 and the remaining insulating layer 16 other than the gate electrode 4 and the gate insulator 6 are removed. Thereafter, oxygen ions are ion-implanted so that a superconducting source region 12 and a superconducting drain region 13 having a substantial thickness are formed in the oxide thin film 11 as shown in FIG. 3H. The condition for the oxygen ion-implantation is that the acceleration energy is 40 KeV and the dose is $1 \times 10^{15}$ to $1 \times 10^{16}$ ions/era$^2$.

Figure 3I:
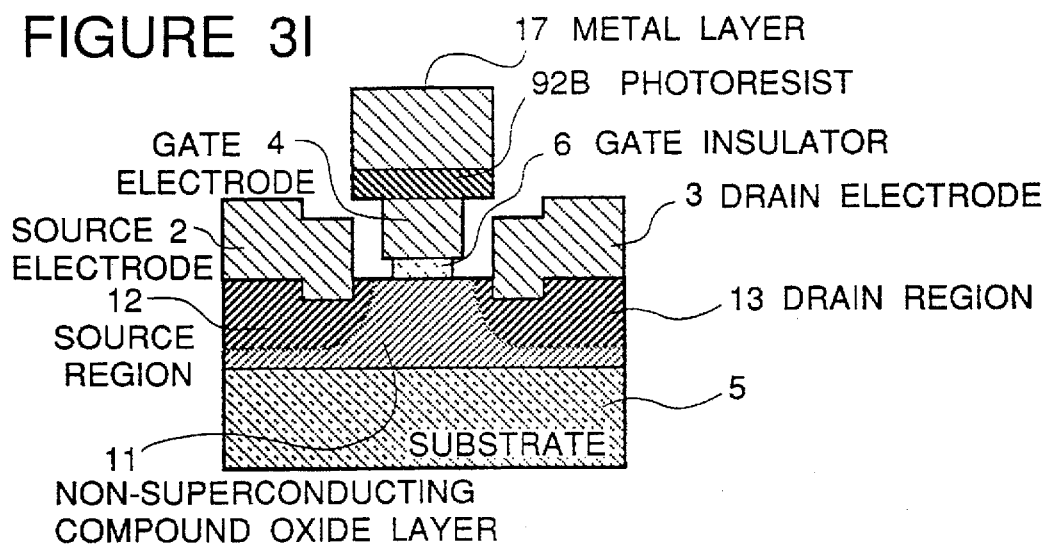

As shown in FIG. 3I, a source electrode 2 and a drain electrode 3 are formed on the superconducting source region 12 and the superconducting drain region 13, respectively. The source electrode 2 and the drain electrode 3 are formed of, for example, a refractory metal such as Ti, W, etc., or Au, or a silicide thereof, similarly to the gate electrode 4. In this process, a film 17 formed of the same material as that of the source electrode 2 and the drain electrode 3 is deposited on the photoresist mask 92B, but the film 17 is removed together with the photoresist mask 92B.

Figure 3J:
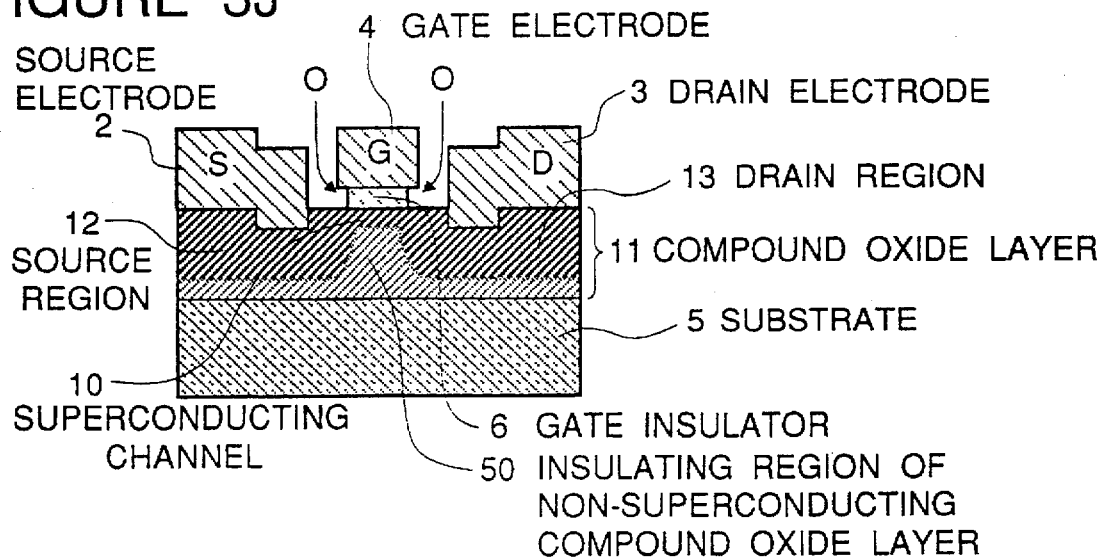

Thereafter, the substrate 5 is heated in an oxygen atmosphere, so that oxygen is diffused from the exposed surface of the oxide thin film 11 between the gate insulator 6 and the source electrode 2 and the drain electrode. As a result, a superconducting channel 10 is formed as shown in FIG. 3J. The condition for the heat-treatment is that the temperature is 350° C., the partial oxygen pressure is $1 \times 10^4$ Pa and the time is one hour.

A portion of the oxide thin film 11 under the superconducting channel 10 is maintained in an insulating condition, and therefore, constitutes an insulating region 50.

Thus, the superconducting device as shown in FIG. 3J is completed. The superconducting device includes the thin film 11 formed on the substrate 5 and constituted of an oxide insulator which is composed of the same constituent elements as those of an oxide superconductor and has the oxygen content smaller than that of the oxide superconductor. In this thin film 11 of the oxide insulator, the superconducting channel 10, the superconducting source region 12 and the superconducting drain region 13 are formed. Under the superconducting channel 10, the insulating region 50 is formed so that the superconducting channel 10 has the thickness of about five nanometers. On the other hand, the superconducting source region 12 and the superconducting drain region 13 are formed continuously to the superconducting channel 10 and has the thickness of about 200 nanometers.

The gate electrode 4 is located on the superconducting channel 10 through the insulator layer (gate insulator) 6 which is formed of, for example, a silicon nitride. The source electrode 2 and the drain electrode 3 are formed on the superconducting source region 12 and the superconducting drain region 13, respectively. The source electrode 2, the drain electrode 3 and the gate electrode 4 are formed of, for example, a refractory metal such as Ti, W, etc., or Au, or a silicide thereof.

As explained above, if the above mentioned super-FET is manufactured in accordance with the above mentioned process, the limitation in the fine processing technique required for manufacturing the super-FET is relaxed. In addition, since the substantially planarized upper surface is obtained, it becomes easy to form conductor wirings in a later process. Accordingly, it is easy to manufacture the super-FET with good repeatability, and the manufactured super-FET has a stable performance.

Embodiment 4

Referring to FIG. 4, there is shown a diagrammatic perspective view of one embodiment of the superconducting device in accordance with the present invention. This embodiment is a Josephson device.

The Josephson device includes a substrate 5 and a compound thin film 11 formed on the substrate 5. The compound thin film 11 has an oxygen introduced region 30, which can be divided into a pair of relatively thick superconducting electrode regions 30B and 30C and an extremely thin weak link region 30A between the pair of superconducting electrode regions 30B and 30C The compound thin film 11 formed on the substrate 5 has a planarized upper surface, and therefore, has a projecting insulating region which is not introduced with oxygen and which is positioned under the extremely thin weak link region 30A.

The compound layer 11 is formed of a compound which itself is not a superconductor but which will become an oxide superconductor when oxygen ions are injected. Therefore, an appropriate amount of oxygen is introduced into the compound thin film 11, the oxygen introduced region 30 becomes an oxide superconductor. For example, this compound includes a compound oxide which is composed of the same constituent elements as those of an oxide superconductor but includes the oxygen amount less than that of the oxide superconductor.

Now, the process for manufacturing the above mentioned superconducting device will be described with reference to FIGS. 5A to 5F. In the embodiment which will be described below, a Y-Ba-Cu-O type compound oxide superconductor material is used for forming the oxide superconductor thin film.

Figure 5A:
FIGS. 5A to 5F are diagrammatic sectional views for illustrating a fourth embodiment of the process in accordance with the present invention for manufacturing the Josephson device.

First, a substrate 5 having a flat upper or principal surface is prepared as shown in FIG. 5A. This substrate 5 is formed of a MgO (100) substrate. As mentioned hereinbefore, however, the substrate can be formed of another insulating substrate such as a CdNdAl$O_4$ (001) substrate or others. If these substrates are used, a c-axis orientated oxide superconductor thin film having a large critical current density in a direction in parallel to the substrate surface can be formed on the substrate.

Figure 5B:
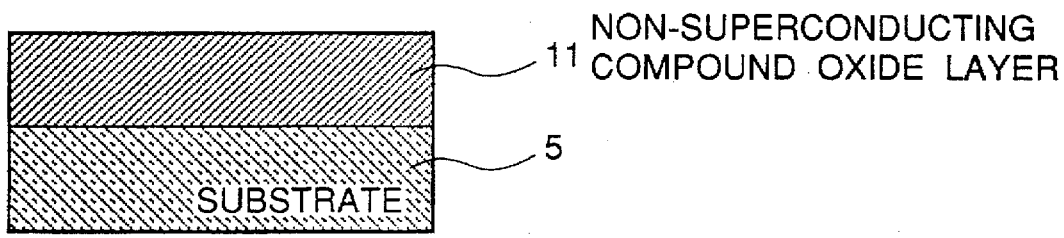

As shown in FIG. 5B, a compound oxide layer 11 of Y-Ba-Cu-O compound oxide is formed on a principal surface of the substrate 5 by for example an off-axis sputtering, or a reactive evaporation process. The Y-Ba-Cu-O compound oxide of the compound oxide layer 11 has an intentionally reduced oxygen content which is smaller than a $Y_1Ba_2Cu_3O_{7-x}$ oxide superconductor which shows superconductivity. Therefore, the Y-Ba-Cu-O compound oxide of the compound oxide layer 11 does not show superconductivity even if it is cooled.

In this example, the off-axis sputtering is performed under the condition that a sputtering gas is composed of Ar and $O_2$ at the rate of Ar:$O_2$=90%:10%, the sputtering gas pressure is 10 Pa, and the temperature is 700° C.

Figure 5C:
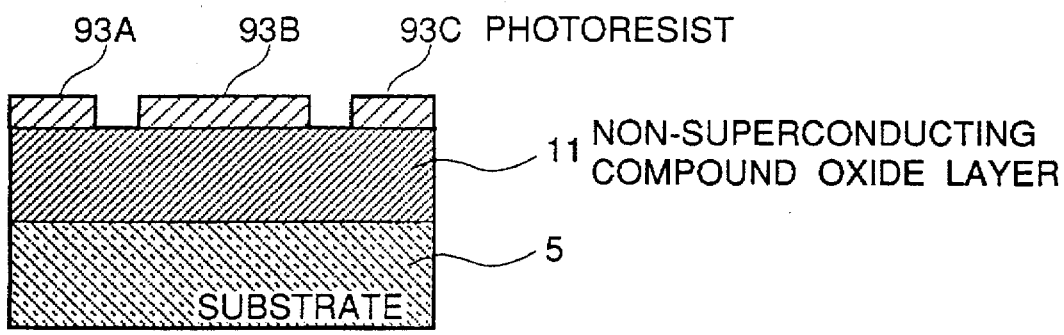

Then, as shown in FIG. 5C, patterned photoresists 93A, 93B and 93C is deposited on the compound thin film 11 so as to cover a region in which a weak link is formed in future, so that the amount of oxygen ion-implanted into a region corresponding to the weak link is suppressed in a later oxygen ion implantation process.

Figure 5D:
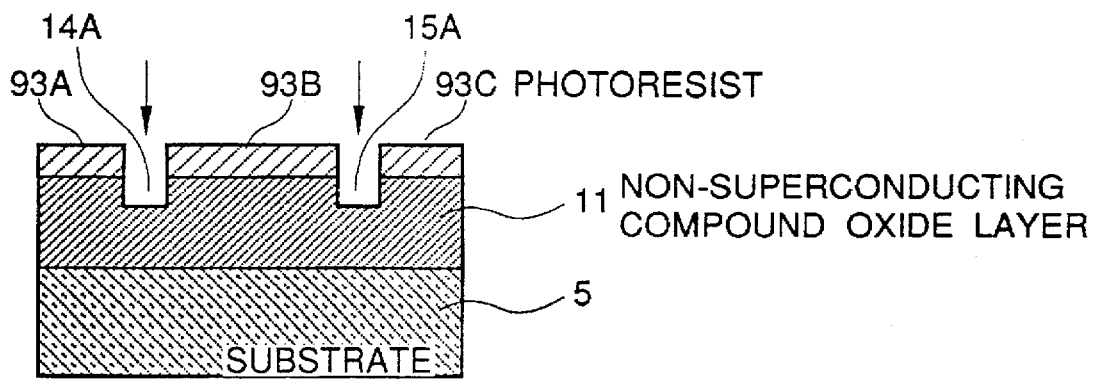
Figure 5E:
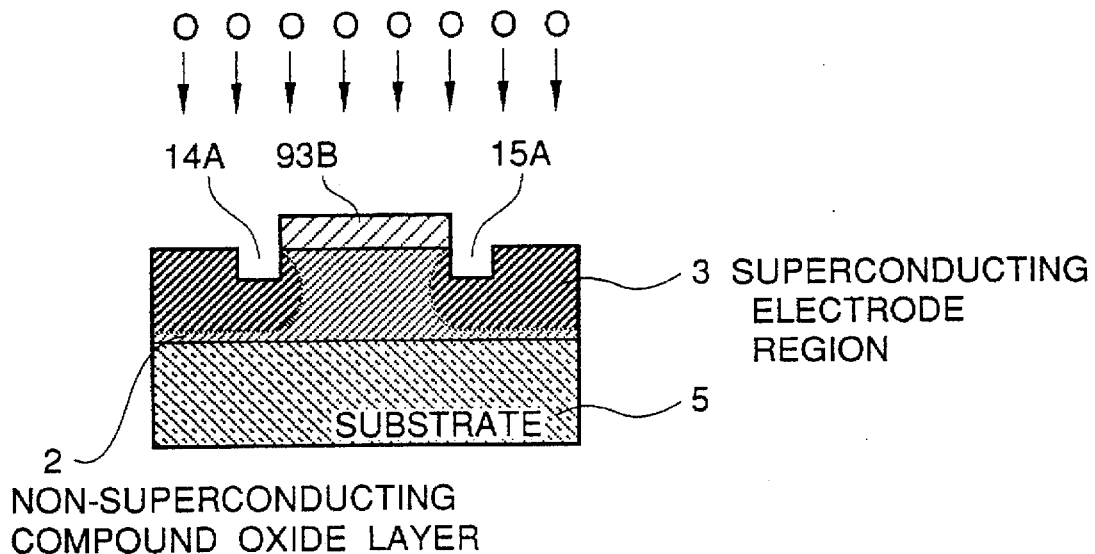
Figure 5F:
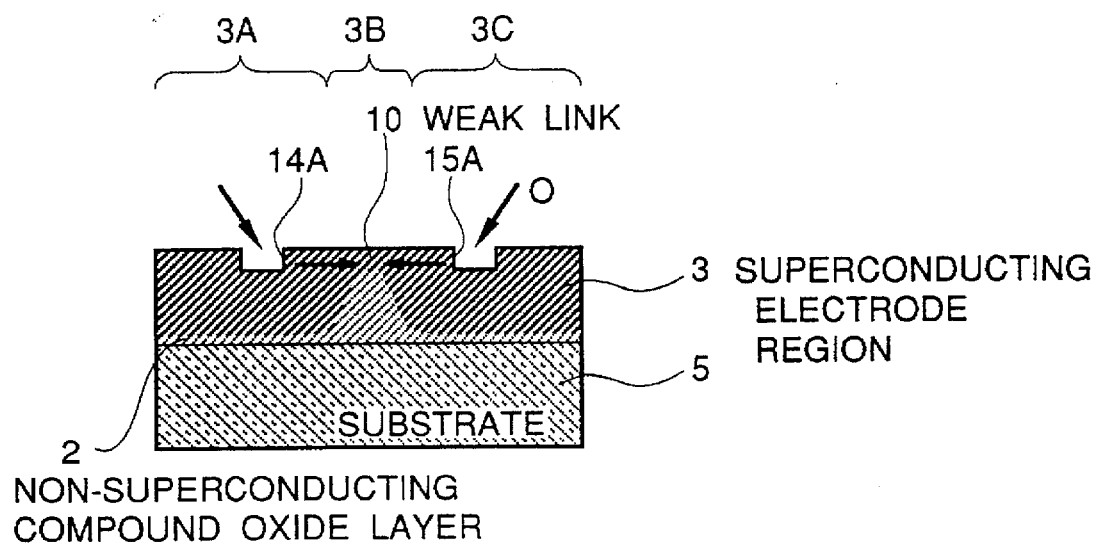

As shown in FIG. 5D, an exposed portion of file compound thin film 11 are etched by a reactive ion etching process or an ion milling using Ar-ions, so that shallow grooves 14A and 15A are formed on the surface of the compound thin film 11. These grooves 14A and 15A are formed in order to ensure that a sharply shaped extremely thin oxide superconductor region can be formed for the weak link, as seen from a later description. Therefore, if a shallow stepped portion can be formed by an etching process with a good controllability, the compound thin film 11 excluding the weak link portion can be uniformly etched. Thereafter, the patterned photoresists 93A and 93C are removed so as to leave only the photoresist 93B corresponding to the weak link formation region, and oxygen ions are deeply ion-implanted into the compound oxide thin film 11 so that a pair of oxygen injected regions 2 and 3 are formed in the compound thin film 11 as shown in FIG. 5E. The pair of oxygen injected regions 2 and 3 become an oxide superconducting region, and have a depth near to the thickness of the compound thin film 11. On the other hand, an oxygen ion injected region is not formed in a central portion masked by the photoresist 93B.

After the remaining photoresist 93B is removed, the substrate 5 is heated in an oxygen atmosphere, so that the oxygen injected regions 2 and 3 are enlarged, and oxygen contained in the oxygen atmosphere is diffused from the surface of the compound thin film 11 which had been masked by the photoresist 91 in the previous process. Since oxygen in the compound thin film 2 is easy to diffuse in a horizontal direction, oxygen introduced from a side surface 14 and 15 of the grooves 14A and 15A in the previous process diffuses in a horizontal direction, and finally, the oxygen injected regions 2 and 3 are coupled with the diffused region, and this diffused region constitutes a weak link 10. This heat-treatment is performed at a temperature of 400° C.

Thus, the superconducting electrode regions 30B and 30C deeply injected with oxygen ions, and the weak link portion 30A horizontally diffused with oxygen are formed. In the completed device, the superconducting layer in the weak link portion 30A has an effective thickness of five to ten nanometers.

In the above mentioned four embodiments, the oxide superconductor thin film can be formed of not only the Y-Ba-Cu-O type compound oxide superconductor material, but also for example a Bi-Sr-Ca-Cu-O type compound oxide superconductor material, and a Tl-Ba-Ca-Cu-O type compound oxide superconductor material.

The invention has thus been shown and described with reference to the specific embodiments. However, it should be noted that the present invention is in no way limited to the details of the illustrated structures but changes and modifications may be made within the scope of the appended claims.

We claim:

1. A superconducting device comprising:

a substrate, a projecting insulating region formed on a principal surface of said substrate, the projecting insulating region being formed of a compound which does not show superconductivity but which becomes an oxide superconductor when oxygen ions are injected therein, a first thin film portion of an oxide superconductor formed on said projecting insulating region, a second thin film portion of the oxide superconductor positioned at one side of the projecting insulating region, the second thin film portion having a thickness larger than a thickness of the first thin film portion, and having defined therein at an upper surface a step with a face parallel to a c-axis of the second thin film portion, and a third thin film portion of the oxide superconductor positioned at the other side of the projecting insulating region, the third thin film portion having a thickness larger than a thickness of the first thin film portion, and having defined therein at an upper surface a step with a face parallel to a c-axis of the third thin film portion, the first thin film portion being continuous with the second thin film portion and the third thin film portion, such that a superconducting current can flow between the second thin film portion and the third thin film portion through the first thin film portion, and such that the first thin film portion of the oxide superconductor positioned on the projecting insulating region of the substrate forms a weak link of a Josephson junction.

2. A superconducting device claimed in claim 1 wherein the projecting insulation region is formed of an oxide which is composed of the same constituent elements as the oxide superconductor but which has an oxygen content which is less than that of the oxide superconductor.

3. A superconducting device claimed in claim 1 further including a first electrode formed on the second thin film portion and a second electrode formed on the third thin film portion, so that a superconducting current can flow between the first and second electrodes through the first thin film portion of the oxide superconductor.

4. A superconducting device comprising:

a substrate, a projecting insulating region formed on a principal surface off said substrate, the projecting insulating region being formed of a compound which does not show superconductivity but which will become an oxide superconductor when oxygen ions are injected therein, a first thin film portion of an oxide superconductor formed on said projecting insulating region, a second thin film portion of the oxide superconductor positioned at one side of the projecting insulating region to be continuous with the first thin film portion, the second thin film portion having defined therein, at an upper surface, a step, a third thin film portion of the oxide superconductor positioned at the other side of the projecting insulating region to be continuous with the first thin film portion, the third thin film portion having defined therein, at an upper surface, a step, the second thin film portion and the third thin film portion having a thickness larger than a thickness of the first thin film portion, a first electrode formed on the second thin film portion, a second electrode formed on the third thin film portion, such that a superconducting current can flow between the first electrode and second electrode through the first thin film portion of the oxide superconductor, and a gate electrode formed over the first thin film portion of the oxide superconductor positioned on the projecting insulating region of the substrate, such that the superconducting device forms a field effect transistor wherein superconducting current flowing between the first and second electrodes through the first thin film portion of the oxide superconductor is controllable by a voltage applied to the gate electrode.

5. A superconducting device claimed in claim 4 wherein each of the first and second electrodes and the gate electrodes is formed of a superconductor material or a normal conductor material.

6. A superconducting device claimed in claim 1 wherein the oxide superconductor thin film portions are formed of a material selected from the group consisting of a Y-Ba-Cu-O type compound oxide superconductor material, a Bi-Sr-Ca-Cu-O type compound oxide superconductor material, and a Tl-Ba-Ca-Cu-O type compound oxide superconductor material.

7. A superconducting device claimed in claim 6 wherein the oxide superconductor thin film portions are c-axis orientated single crystal film.

8. A superconducting device claimed in claim 1 wherein the substrate is formed of a material selected from the group consisting of a MgO (100) substrate, a SrTiO$_3$ (100) substrate, a CdNdAlO$_4$ (001) substrate, and a semiconductor substrate.

9. A superconducting device claimed in claim 1 wherein the substrate is formed of a silicon substrate and a principal surface of the silicon substrate is coated with an insulating material layer which is formed of a MgAl$_2$O$_4$ layer and a BaTiO$_3$ layer.

10. A superconducting device claimed in claim 4 wherein the projecting insulating region is formed of an oxide which is composed of the same constituent elements as the oxide superconductor but which has an oxygen content which is less than that of the oxide superconductor.

11. A superconducting device claimed in claim 4 wherein the oxide superconductor thin film portions are formed of a material selected from the group consisting of a Y-Ba-Cu-O type compound oxide superconductor material, a Bi-Sr-Ca-Cu-O type compound oxide superconductor material, and a Tl-Ba-Ca-Cu-O type compound oxide superconductor material.

12. A superconducting device claimed in claim 11 wherein the oxide superconductor thin film portions are c-axis orientated single crystal films.

13. A superconducting device claimed in claim 4 wherein the substrate is formed of a material selected from the group consisting of a MgO (100) substrate, a SrTiO$_3$ (100) substrate, a CdNdAl0$_4$ (001) substrate and a semiconductor substrate.

14. A superconducting device claimed in claim 4 wherein the substrate is formed of a silicon substrate and a principal surface of the silicon substrate is coated with an insulating material layer which is formed of a MgAl$_2$O$_4$ layer and a BaTiO$_3$ layer.

15. A superconducting device claimed in claim 1 wherein the first thin film portion has a thickness ranging from five nanometers to ten nanometers.

16. A superconducting device claimed in claim 1, wherein a height of the step formed in the second thin film portion is substantially equal to a height of the step formed in the third thin film portion; and the thickness of the first thin film superconducting portion is substantially equal to the height of the steps.

17. A superconducting device claimed in claim 16, wherein the thickness of the first thin film superconducting portion is five nanometers to ten nanometers.

18. A superconducting device claimed in claim 1, wherein the steps of the first thin film portion of the oxide superconductor lie in the same plane.

19. A superconducting device claimed in claim 4, further including an insulator layer between the gate electrode and the first thin film portion of the oxide superconductor.

* * * * *